United States Patent
Moens et al.

(10) Patent No.: US 9,818,854 B2
(45) Date of Patent: Nov. 14, 2017

(54) ELECTRONIC DEVICE INCLUDING A BIDIRECTIONAL HEMT

(71) Applicant: SEMICONDUCTOR COMPONENTS INDUSTRIES, LLC, Phoenix, AZ (US)

(72) Inventors: Peter Moens, Erwetegem (BE); Balaji Padmanabhan, Tempe, AZ (US); Herbert De Vleeschouwer, Zulte (BE); Prasad Venkatraman, Gilbert, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/133,679

(22) Filed: Apr. 20, 2016

(65) Prior Publication Data
US 2016/0322351 A1 Nov. 3, 2016

Related U.S. Application Data

(60) Provisional application No. 62/154,705, filed on Apr. 30, 2015, provisional application No. 62/154,775, filed on Apr. 30, 2015.

(51) Int. Cl.
*H01L 27/088* (2006.01)
*H01L 29/40* (2006.01)
(Continued)

(52) U.S. Cl.
CPC ........ *H01L 29/747* (2013.01); *H01L 23/4952* (2013.01); *H01L 23/49524* (2013.01);
(Continued)

(58) Field of Classification Search
None
See application file for complete search history.

(56) References Cited

U.S. PATENT DOCUMENTS

2005/0189561 A1 9/2005 Kinzer
2006/0175633 A1 8/2006 Kinzer
(Continued)

OTHER PUBLICATIONS

Nakajima, Akira et al., "GaN-Based Bidirectional Super HFETs Using Polarization Junction Concept on Insulator Substrate," Proceedings of the 2012 24th International Symposium on Power Semiconductor Devices and ICs, Bruges, Belgium, dated Jun. 2012, pp. 265-268.

(Continued)

*Primary Examiner* — Daniel Whalen
(74) *Attorney, Agent, or Firm* — Abel Law Group, LLP

(57) ABSTRACT

An electronic device can include a bidirectional HEMT. In an aspect, the electronic device can include a pair of switch gate and blocking gate electrodes, wherein the switch gate electrodes are not electrically connected to the blocking gate electrodes, and the first blocking, first switch, second blocking, and second switch gate electrodes are on the same die. In another aspect, the electronic device can include shielding structures having different numbers of laterally extending portions. In a further aspect, the electronic device can include a gate electrode and a shielding structure, wherein a portion of the shielding structure defines an opening overlying the gate electrode.

20 Claims, 5 Drawing Sheets

(51) Int. Cl.
*H01L 29/747* (2006.01)
*H01L 29/74* (2006.01)
*H01L 23/495* (2006.01)
*H01L 29/205* (2006.01)
*H01L 29/423* (2006.01)
*H01L 29/778* (2006.01)
*H01L 25/11* (2006.01)
*H03K 17/687* (2006.01)
*H01L 23/00* (2006.01)
*H01L 21/8258* (2006.01)
*H01L 27/06* (2006.01)

(52) U.S. Cl.
CPC .. *H01L 23/49541* (2013.01); *H01L 23/49562* (2013.01); *H01L 23/49575* (2013.01); *H01L 24/40* (2013.01); *H01L 25/115* (2013.01); *H01L 29/205* (2013.01); *H01L 29/404* (2013.01); *H01L 29/4238* (2013.01); *H01L 29/742* (2013.01); *H01L 29/7416* (2013.01); *H01L 29/7786* (2013.01); *H01L 29/7787* (2013.01); *H03K 17/6874* (2013.01); *H01L 21/8258* (2013.01); *H01L 27/0629* (2013.01); *H01L 27/088* (2013.01); *H01L 27/0883* (2013.01); *H01L 2224/0603* (2013.01); *H01L 2224/40245* (2013.01); *H01L 2224/48247* (2013.01); *H01L 2224/49113* (2013.01); *H01L 2224/73221* (2013.01); *H03K 2017/6878* (2013.01); *H03K 2217/0009* (2013.01); *H03K 2217/0018* (2013.01)

(56) References Cited

U.S. PATENT DOCUMENTS

| | | |
|---|---|---|
| 2007/0215899 A1 | 9/2007 | Herman |
| 2008/0237632 A1 | 10/2008 | Kinzer |
| 2014/0159116 A1 | 6/2014 | Briere et al. |
| 2014/0374766 A1* | 12/2014 | Bahl ................... H01L 27/0629 257/76 |
| 2016/0322485 A1* | 11/2016 | Padmanabhan ....... H01L 29/747 |

OTHER PUBLICATIONS

Morita, Tatsuo et al., "650V 3.1 mΩcm2 GaN-based Monolithic Bidirectional Switch Using Normally-off Gate Injection Transistor," Proceedings IEDM2007, Semiconductor Device Research Center, Semiconductor Company, Matsushita Electric—Panasonic, dated 2007, pp. 865-868.

* cited by examiner

ELECTRONIC DEVICE INCLUDING A BIDIRECTIONAL HEMT

CROSS-REFERENCE TO RELATED APPLICATIONS

This application claims priority under 35 U.S.C. §119(e) to U.S. Provisional Patent Application No. 62/154,705 entitled "Wide Band Gap Cascode Device, Its Use in a Half Bridge Circuit, and Related Packages," by Balaji Padmanabhan et al., filed Apr. 30, 2015, and to U.S. Provisional Patent Application No. 62/154,775 entitled "Wide Band Gap Cascode Device, Its Use in a Half Bridge Circuit, and Related Packages," by Balaji Padmanabhan et al., filed Apr. 30, 2015, which are assigned to the current assignee hereof and incorporated herein by reference in their entireties.

FIELD OF THE DISCLOSURE

The present disclosure relates to electronic devices, and more particularly to, electronic devices that include bidirectional high-electron mobility transistors.

RELATED ART

High electron mobility transistors (HEMTs), and GaN transistors in particular, are used for their ability to carry large amounts of current at relatively high temperatures. Electronic devices that include bidirectional HEMTs have one or more problems. Further improvements in electronic devices including bidirectional HEMTs are desired.

BRIEF DESCRIPTION OF THE DRAWINGS

Embodiments are illustrated by way of example and are not limited in the accompanying figures.

Figure 1:
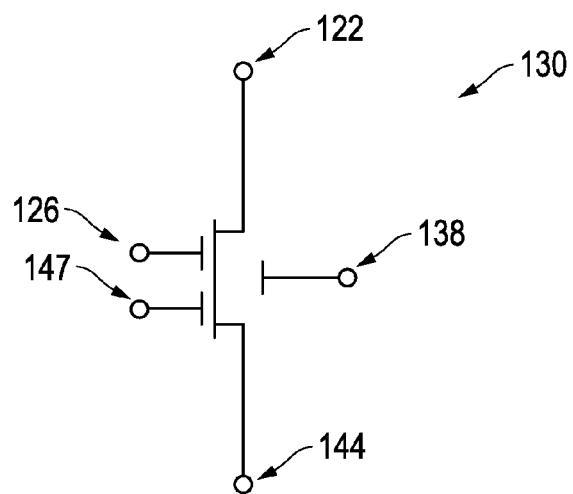
FIG. 1 includes a schematic of a bidirectional HEMT.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "compound semiconductor" is intended to mean a semiconductor material that includes at least two different elements. Examples include SiC, SiGe, GaN, InP, $Al_v Ga_{(1-v)}N$, CdTe, and the like. A III-V semiconductor material is intended to mean a semiconductor material that includes at least one trivalent metal element and at least one Group 15 element. A III-N semiconductor material is intended to mean a semiconductor material that includes at least one trivalent metal element and nitrogen. A Group 13-Group 15 semiconductor material is intended to mean a semiconductor material that includes at least one Group 13 element and at least one Group 15 element.

The term "carrier impurity" is intended to mean (1) when an acceptor, an impurity within a compound having a different valence state as compared to at least 90% of all cations within the compound, or (2) when a donor, an impurity within a compound having a different valence as compared to at least 90% of all anions within the compound. For example, C, Mg, and Si are acceptors with respect to GaN because they can trap electrons. As used herein, Al is not a carrier impurity with respect to GaN because Al and Ga have a 3+ valence. A carrier impurity may be intentionally added or may be present as a naturally occurring impurity or as a consequence of forming a layer that includes the impurity. Acceptors and donors are carrier impurities of opposite carrier types.

Although a layer or a region may be described herein as a donor impurity type or an acceptor impurity type, skilled artisans understand that the impurity types can be reversed and are also possible in accordance with the present description.

Unless stated explicitly to the contrary, the terms "carrier impurity concentration" or "concentration of a carrier impurity", when referring to a layer, a film, or a region, is intended to mean an average concentration for such layer, film, or region.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

Group numbers corresponding to columns within the Periodic Table of Elements based on the IUPAC Periodic Table of Elements, version dated Jan. 21, 2011.

The term "normal operation" and "normal operating state" refer to conditions under which an electronic component or device is designed to operate. The conditions may be obtained from a data sheet or other information regarding voltages, currents, capacitances, resistances, or other electrical parameters. Thus, normal operation does not include operating an electrical component or device well beyond its design limits.

The term "high voltage," with reference to a layer, a structure, or a device, means that such layer, structure, or device can withstand at least 150 V difference across such layer, structure, or device (e.g., between a source and a drain of a transistor when in an off-state) without exhibiting dielectric breakdown, avalanche breakdown, or the like.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a bidirectional HEMT. In an aspect, the electronic device can include a first blocking gate electrode coupled to a first drain/source electrode, and a first switch gate electrode disposed between first drain/source electrode and the first blocking gate electrode, wherein the first switch gate electrode is not electrically connected to the first blocking gate electrode. The electronic device can further include a second blocking gate electrode coupled to the first source/drain electrode, and a second switch gate electrode disposed between first source/drain electrode and the second blocking gate electrode, wherein the second switch gate electrode is not electrically connected to the second blocking gate electrode. The switch gate electrodes can allow for changing the current flow with faster voltage signals as compared to the switch gate electrodes not being present or if they were electrically connected to the blocking gate electrodes. The first blocking, first switch, second blocking, and second switch gate electrodes can be on the same die, thus, allowing for a higher level of integration and a smaller package size.

In another aspect, the electronic device can include a first gate electrode closer to a drain/source electrode than to a source/drain electrode. The electronic device can further include a first shielding structure electrically connected to the drain/source electrode and including a first laterally extending portion, wherein the first laterally extending portion is part of a first interconnect level overlying the first gate electrode, and as compared to the first gate electrode, the first laterally extending portion extends in a horizontal direction closer to the source/drain electrode. The electronic device can include a second gate electrode closer to the source/drain electrode than to the drain/source electrode. The electronic device can also include a second shielding structure electrically connected to the source/drain electrode and including a second laterally extending portion, wherein the second laterally extending portion is part of a different interconnect level overlying the second gate electrode; and as compared to the second gate electrode, the second laterally extending portion extends in a horizontal direction closer to the drain/source electrode. Thus, the shielding structures may have different numbers of laterally extending portions within different shielding structures that can provide sufficient shielding and less capacitance with an underlying gate electrode.

In a further aspect, the electronic device can include a gate electrode closer to a drain/source electrode than to a source/drain electrode. The electronic device can also include a shielding structure electrically connected to the drain/source electrode and including a portion that defines an opening overlying the gate electrode. The opening helps to reduce capacitive coupling between the gate electrode and the shielding structure, and the portion can extend further toward the source/drain electrode to reduce capacitive coupling between the gate electrode and the source/drain electrode.

The concepts and design considerations are better understood after reading the embodiments that follow. Much of the description below will address GaN as the material of the channel layer as a specific example in order to simplify understanding of the concepts and design considerations. Clearly, embodiments of the present invention are not limited to a GaN channel layer. After reading the specification in its entirety, skilled artisans will appreciate that the embodiments are merely for illustrative purposes and do not limit scope of the appended claims.

FIG. 1 includes a schematic of a bidirectional HEMT 130 that is controlled by a pair of gates. A drain/source of the bidirectional HEMT 130 is coupled to drain/source terminal 122, and a source/drain of the bidirectional HEMT 130 is coupled to source/drain terminal 144. One of the gates of the bidirectional HEMT 130 is coupled to a gate terminal 126, and another gate of the bidirectional HEMT 130 is coupled to a gate terminal 147. The bidirectional HEMT 130 is within or over a die substrate that is coupled to a substrate terminal 138. In a particular embodiment, each of the couplings can be an electrical connection.

Figure 2:
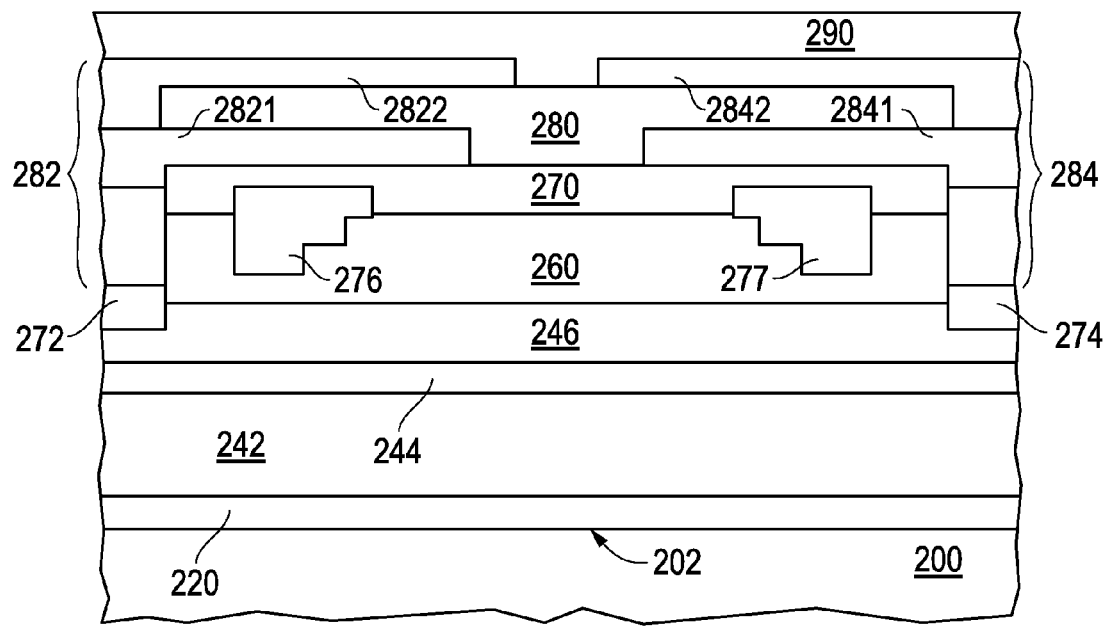
FIG. 2 includes an illustration of a cross-sectional view of a portion of a workpiece including the bidirectional HEMT of FIG. 1 in accordance with an embodiment.

FIG. 2 includes an illustration of a cross-sectional view of a portion of a workpiece that includes a substrate 200, a nucleation layer 220, a semiconductor layer, and a dielectric layer 260. The substrate 200 has a primary surface 202 and can include silicon, sapphire (monocrystalline $Al_2O_3$), silicon carbide (SiC), aluminum nitride (AlN), gallium oxide ($Ga_2O_3$), spinel ($MgAl_2O_4$), Gallium Nitride (GaN), another suitable substantially monocrystalline material, or the like. The selection of the particular material and crystal orientation along the primary surface 202 can be selected depending upon the composition of the semiconductor layer that will be subsequently formed over the substrate 200. The nucleation layer 220 can help to epitaxially grow the semiconductor layer. In an embodiment, the nucleation layer 220 may include one or more elements that are common to the subsequently formed semiconductor layer. In a particular embodiment, the nucleation layer can include aluminum nitride when an aluminum-containing semiconductor layer is being formed over the nucleation layer 220. The thickness of the nucleating layer can be in a range of 20 nm to 1000 nm.

The semiconductor layer can include a buffer film 242, a channel film 244, and a barrier film 246. The composition of the buffer film 242 may depend on the composition of the channel film 244. In an embodiment, the channel film 244 includes GaN, and the buffer film 242 includes AlGaN. The composition of the buffer film 242 can be changed as a function of thickness, such that the buffer film 242 has a relatively greater aluminum content closer to the nucleation layer 220 and relatively greater gallium content closer to the channel film 244. In a particular embodiment, the cation (metal atoms) content in the buffer film 242 near the nucleation layer 220 can be 10% to 100% Al with the remainder Ga, and the cation content in the buffer film 242 near the channel film 244 can be 0% to 50% Al with the remainder Ga. The thickness of the buffer film 242 may depend on the designed drain-to-source voltage ($V_{DS}$) of the circuit. In an embodiment, the buffer film 242 has a thickness in a range of approximately 1 micron to 5 microns. The buffer film 242 may be thicker than 5 microns, if the electronic device is designed to operate at very high voltages.

The channel film 244 can include a III-V semiconductor material, and in an embodiment, can be a III-N material. In a particular embodiment, the channel film 244 includes monocrystalline GaN. The channel film 244 can have a thickness in a range of approximately 20 nm to 4000 nm. The barrier film 246 can be used to help reduce the likelihood of migration of contaminants or other materials between one or more films underlying the barrier film 246 and gate dielectric layer 260. In a particular embodiment, the barrier film 246 can include AlGaN, wherein the cation content is 5% to 30% aluminum with the remainder gallium. The barrier film 246 can have a thickness in a range of approximately 2 to 30 nm. In another embodiment, a thin spacer layer is present between barrier layer 246 and the channel layer 244. The spacer layer is between 0.5 nm and 2 nm. The Al content of the spacer layer is between 80 wt % and 100 wt %.

The semiconductor layer is formed using an epitaxial growth technique. In a particular embodiment, metal-containing films can be formed using metalorganic chemical vapor deposition. In another embodiment, different composition for the semiconductor layer may be used, e.g., InAlGaN, InP, or the like.

The dielectric layer 260 includes films, one of more of which can be a gate dielectric for the bidirectional HEMT. The gate dielectric can include a wide bandgap high dielectric constant ("high k") material, or any combination thereof. The high k value can allow for a higher gate overdrive. The high k material has a similar or as good quality as an $Al_2O_3$ formed by atomic layer deposition. Such high k material also has a high etch selectivity to silicon nitride, so it can additionally function as an etch stop when etching an overlying layer that includes silicon nitride. Thus, the high k material assists in increasing etch reproducibility and repeatability to improve the manufacturability of the device and also improving the performance of transistor being formed. The gate dielectric layer 260 can include a silicon nitride film and an AlN film. The silicon nitride film can have a thickness and a range of approximately 5 nm to 60 nm, and the AlN nitride film can have a thickness in a range of approximately 1 nm to 20 nm. In another embodiment, the gate dielectric layer 260 can include fewer or more films that may have the same or different compositions as described. The gate dielectric layer 260 can have nitride-nitride bonding between the silicon nitride and AlN films and that reduces formation of interface states at the silicon nitride/AlN interface that can improve dispersion/current collapse related phenomena. An optional $Al_2O_3$ film (not illustrated) can be formed by oxidizing a portion of the AlN film in an oxidizing ambient, such as $O_2$, $N_2O$, or the like.

The dielectric layer 260 can further include a capping film can be used to protect the gate dielectric. The capping layer can include silicon nitride and have a thickness in a range of approximately 20 nm to 500 nm. The gate dielectric and the capping film can be formed using a chemical or physical vapor technique.

In an embodiment, the nucleating layer 220, the semiconductor layer, and the dielectric layer 260 can be formed without exposing the workpiece to air or another oxygen-containing gas. Thus, the layers and films can be formed without an oxide at an interface between any of the layers and films. In another embodiment, the workpiece may be exposed to air between forming any one or more of the films or layers. If an interfacial oxide is not to remain in the finished device, the interfacial oxide may be reduced in a reducing ambient or etched, for example, back sputtering, to remove the interfacial oxide before forming the subsequent layer or film. In still another embodiment, an oxide film may be formed and remain. For example, after forming the gate dielectric, the workpiece may be exposed to air before forming the capping film.

FIG. 2 further includes a source/drain electrode 272, a gate electrode 276, and gate electrode 277, a drain/source electrode 274, shielding structures 282 and 284, interlevel dielectric (ILD) layers 270 and 280, and a passivation layer 290. After forming part of the dielectric layer 260, portions of the barrier film 246 and the dielectric layer 260 can be patterned to define openings, and the drain/source electrode 272 and source/drain electrode 274 are formed within the openings. The drain/source electrode 272 and source/drain electrode 274 can include conductive layer having one or more films of conductive material. The conductive layer is at least 50 wt % aluminum, copper, a noble metal, or an alloy of any of the foregoing. In another embodiment, the drain/source electrode 272 and source/drain electrode 274 may overlie and not extend into the barrier film 246.

After forming the remainder of the dielectric layer 260, portions of the dielectric layer 260 can be patterned to define openings, and interconnects that are parts of the shielding structures 282 and 284, a gate electrode 276, and a gate electrode 277 are formed. The interconnects overlie and are connected to the drain/source and source/drain electrodes 272 and 274. Each of gate electrodes 276 and 277 has a stepped structure where the portion closest to the channel film 244 is the gate for the transistor, and portions at higher elevations and extending laterally provide shielding help to reduce gate capacitance. In particular, the shielding portion of the gate electrode 276 extends laterally towards the source/drain electrode 274 and helps to reduce capacitance between the gate electrode 276 and the source/drain electrode 274. Similarly, the shielding portion of the gate electrode 277 extends laterally towards the drain/source electrode 272 and helps to reduce capacitance between the gate electrode 277 and the drain/source electrode 272.

The interconnects and the gate electrodes 276 and 277 can be formed from a conductive layer than may include one or more films. In an embodiment, a conductive layer includes a conductive film that is closer to the semiconductor layer as compared to any other conductive film in the conductive layer. The conductive film has a composition selected to provide a proper work function for the transistors being formed. The conductive film can include Ti, TiN, Al, Pd, Pt, W, Au, Ni, or a stack of any combination thereof and has a thickness in a range of 50 nm to 200 nm. The conductive layer can further include another conductive film that is more conductive than the conductive film closer to the semiconductor layer. This other conductive film can include at least 50 wt % aluminum, copper, a noble metal, or an alloy of any of the foregoing.

The ILD layers 270 and 280, and the remainder of the shielding structures 282 and 284 are then formed. Each of the ILD layers 270 and 280 can include one or more films of oxide, nitride, or oxynitride, and in a particular embodiment is a silicon nitride film. Each of the ILD layers 270 and 280 has a thickness in a range of 0.1 microns to 4 microns.

Portions of the shielding structures are formed before and after each of the ILD layers 270 and 280. Laterally extending portions 2821 and 2841 are formed after forming the ILD layer 270 and before forming the ILD layer 280, and the laterally extending portions 2822 and 2842 are formed after forming the ILD layers 270 and 280. In an embodiment, the laterally extending portions 2821 and 2841 may be formed at the same interconnect level, and the laterally extending portions 2822 and 2842 may be formed at a different interconnect level. The shielding structure 282, including the portions 2821 and 2822, is electrically connected to the drain/source electrode 272, and the shielding structure 284, including the portions 2841 and 2842, is electrically connected to the source/drain electrode 274.

The laterally extending portions 2821, 2822, 2841, and 2842 help to reduce gate-to-source/drain capacitance (between the gate electrode 276 and a combination of the source/drain electrode 274 and shielding structure 284) and gate-to-drain/source capacitance (between the gate electrode 277 and a combination of the drain/source electrode 272 and the shielding structure 282). For the shielding structure 282, the laterally extending portion 2821 laterally extends over the gate electrode 276 to a location laterally closer to the source/drain electrode 274, as compared to the gate electrode 276, and the laterally extending portion 2822 laterally extends over the gate electrode 276 and the portion 2821 to a location laterally closer to the source/drain electrode 274, as compared to the gate electrode 276 and the portion 2821. For the shielding structure 284, the laterally extending portion 2841 laterally extends over the gate electrode 277 to a location laterally closer to the drain/source electrode 272, as compared to the gate electrode 277, and the laterally extending portion 2842 laterally extends over the gate electrode 277 and the portion 2841 to a location laterally closer to the drain/source electrode 272, as compared to the gate electrode 277 and the portion 2841.

The remainder of the shielding structures 282 and 284, including the portions 2821, 2822, 2841, and 2842, can include any of the materials as previously described with respect to the drain/source electrode 272 and source/drain electrode 274. The shielding structures 282 and 284 can have the same composition or a different composition as compared each other or the electrodes 272 and 274.

The passivation layer 290 can be formed over the ILD layer 280 and the shielding structures 282 and 284. The passivation layer can include one or more films of a nitride or an oxynitride, and may include one or more films of an oxide.

Figure 3:
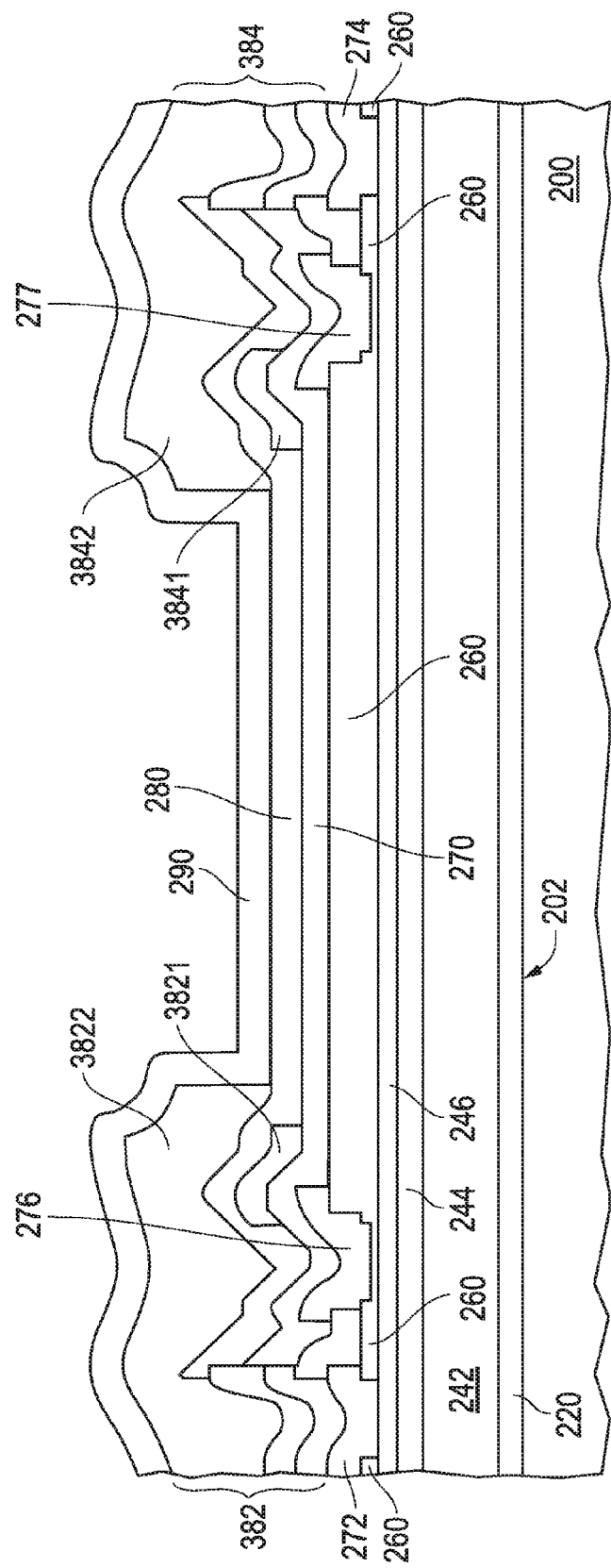
FIG. 3 includes an illustration of a cross-sectional view of a portion of a workpiece including the bidirectional HEMT of FIG. 1 in accordance with another embodiment.

FIG. 3 includes a cross-sectional view of an electronic device in accordance with an alterative embodiment. As compared to FIG. 2, FIG. 3 illustrates more accurately the features and elevational differences that would be seen. The embodiment of FIG. 3 is similar to but has at least one significant difference with respect to the embodiment as illustrated in FIG. 2. As illustrated in FIG. 3, the shielding structures 382 and 384 include laterally extending portions 3821 and 3841 that are patterned such that openings overlie the gate electrodes 276 and 277, respectively. The portions 3821 and 3841 are connected to the remainder of the shielding structures 382 and 384, respectively, at locations not illustrated in FIG. 3. In an embodiment, at most 90%, at most 50%, or at least 40% of the gate electrode 276 is covered by the laterally extending portion 3821. In another embodiment, at most 90%, at most 50%, or at least 40% of the gate electrode 277 is covered by the laterally extending portion 3841. Laterally extending portions 3822 and 3842 are similar to laterally extending portions 2822 and 2842 described with respect to FIG. 2. As compared to the embodiment of FIG. 2, the openings in the portions 3821 and 3841 help to reduce gate-to-drain/source (between the gate electrode 276 and a combination of the drain/source electrode 272 and shielding structure 282) and gate-to-source/ drain capacitance (between the gate electrode 277 and a combination of the source/drain electrode 274 and the shielding structure 284). The shielding structures 382 and 384 can include any of the materials previously described with respect to the shielding structures 282 and 284.

Figure 4:
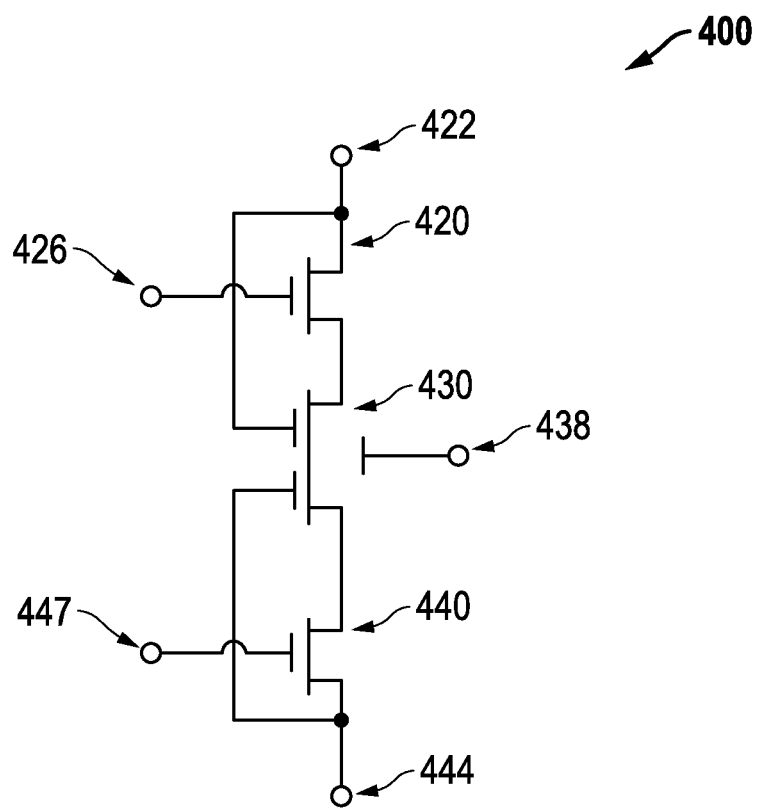
FIG. 4 includes a circuit schematic of a bidirectional HEMT circuit.

FIG. 4 includes a schematic of a circuit 400 that includes a bidirectional HEMT 430 and switch transistors 420 and 440. A drain/source of the switch transistor 420 is coupled to a drain/source terminal 422, and a source/drain of the switch transistor 420 is coupled to a drain/source of the bidirectional HEMT 430. A source/drain of the bidirectional HEMT 430 is coupled to a drain/source of the switch transistor 440, and a source/drain of the switch transistor 440 is coupled to source/drain terminal 444. One of the gates of the bidirectional HEMT 430 is coupled to the drain/source of the switch transistor 420, and another gate of the bidirectional HEMT 430 is coupled to the source/drain of the switch transistor 440. The gate of the switch transistor 420 is coupled to a gate terminal 426, and the gate of the switch transistor 440 is coupled to a gate terminal 447. The bidirectional HEMT 430 is within or over a die substrate that is coupled to a substrate terminal 438. In a particular embodiment, each of the couplings can be electrical connections.

In an embodiment, switch transistors 420 and 440 can be enhancement mode transistors, and in another embodiment, the switch transistors 420 and 440 can be depletion mode transistors. The switch transistors 420 and 440 can be parts of the same die as the bidirectional HEMT 430, or the switch transistors 420 and 440 and the bidirectional HEMT 430 can be on different dies. The switch transistors 420 and 440 can be Si metal-oxide-semiconductor field-effect transistors (MOSFETs) or can include a compound semiconductor material (e.g., SiC, $Al_{(1-x)}Ga_xN$ where $0 \leq x \leq 1$, GaAs, InP, or the like).

Figure 5:
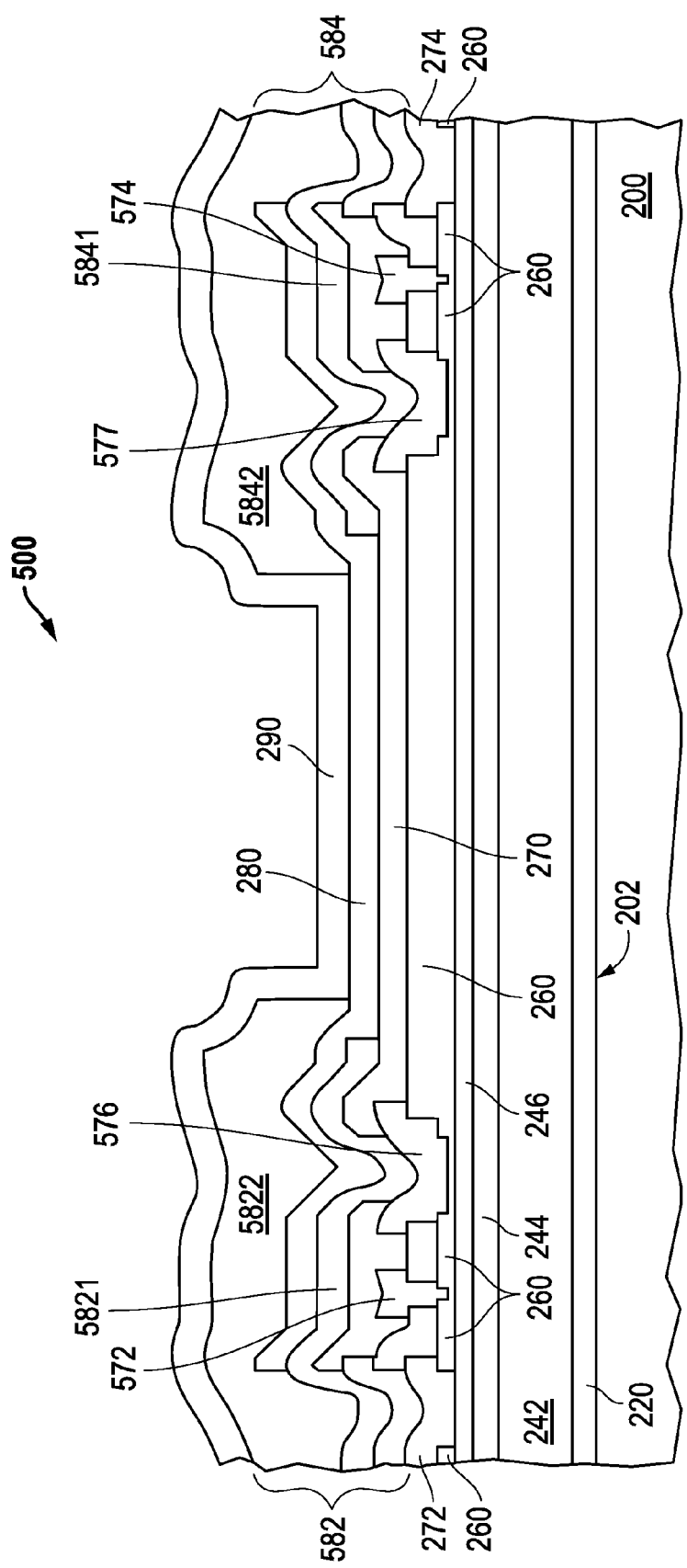
FIG. 5 includes an illustration of a cross-sectional view of a portion of a workpiece including the circuit of FIG. 4 in accordance with an embodiment.

FIG. 5 includes a cross-sectional view of an electronic device 500 that includes the transistors 420, 430, and 440 on the same die. The layers and compositions as illustrated in the embodiment of FIG. 5 can be the same as previously described with respect to the embodiment of FIG. 3. Thus, the patterning of the layers is a difference between the embodiments of FIGS. 3 and 5. The switch gate electrode 572 is the gate for the switch transistor 420, the blocking gate electrode 576 is one of the gates for the bidirectional HEMT 430, the blocking gate electrode 577 is the other gate for the bidirectional HEMT 430, and the switch gate electrode 574 is the gate for the switch transistor 440. The direction of current flow is controlled by the switch transistors 420 and 440 via the switch gate electrodes 572 and 574. The blocking gate electrode 576 allows the switch transistor 420 to be turned on when the voltage difference between the switch gate electrode 572 and the drain/source electrode 272 is in a range of 5V to 30 V. Similarly, the blocking gate electrode 577 allows the switch transistor 440 to be turned on when the voltage difference between the switch gate electrode 574 and the drain/source electrode 274 is in a range of 5V to 30 V.

The shield structures 582 and 584 include the laterally extending portions 5821, 5822, 5841, and 5842. The laterally extending portion 5821 overlies the switch gate electrode 572 and makes physical and electrical contact with the blocking gate electrode 576. The laterally extending portion 5841 overlies the switch gate electrode 574 and makes physical and electrical contact with the blocking gate electrode 577. In another embodiment, either or both of the laterally extending portions 5821 and 5841 can include an opening over its corresponding switch gate electrode 572 or 574 to reduce gate capacitance of such switch gate electrode and may allow for faster switching speeds for the corresponding switch transistor. The laterally extending portions 5822 and 5842 extend laterally further than their underlying laterally extending portions 5821 and 5841.

Figure 6:
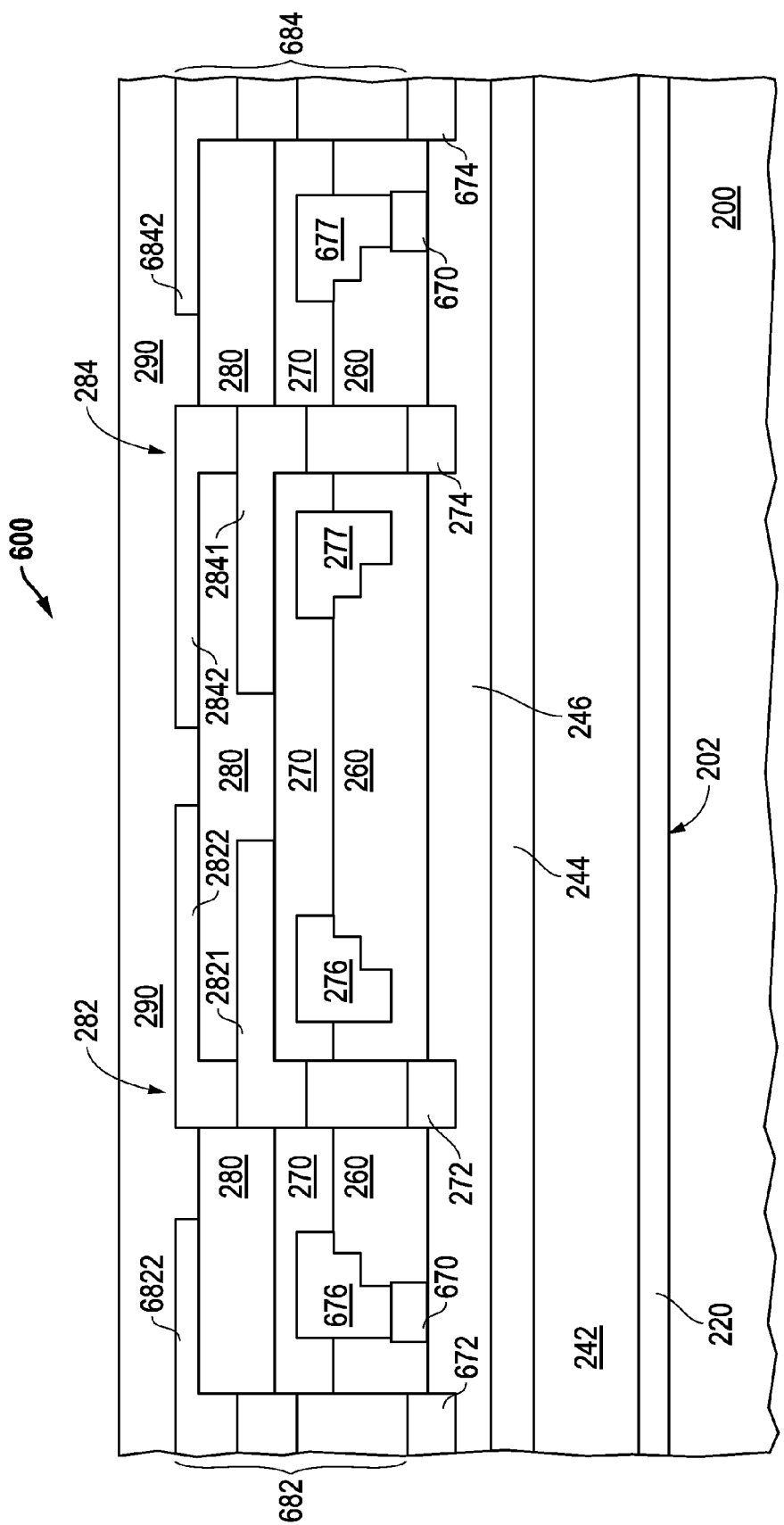
FIG. 6 includes an illustration of a cross-sectional view of a portion of a workpiece including the circuit of FIG. 4 in accordance with another embodiment.

FIG. 6 includes a cross-sectional view of an electronic device 600 that includes the transistors 420, 430, and 440 on the same die. The electronic device 600 includes additional electrodes and shielding structures. The structures illustrated near the center of FIG. 6 are parts the bidirectional HEMT 430 and such structures are described with respect to FIG. 2. The structures near the left-hand side of FIG. 6 correspond to the switch transistor 420, and the structures near the right-hand side correspond to the switch transistor 440.

A switch gate electrode 672 is the gate for the switch transistor 420, the blocking gate electrode 276 is one of the gates for the bidirectional HEMT 330, the blocking gate electrode 277 is the other gate for the bidirectional HEMT 330, and the switch gate electrode 674 is the gate for the switch transistor 440. The direction of current flow is controlled by the switch transistors 420 and 440 via the switch gate electrodes 672 and 674. The blocking gate electrode 676 allows the switch transistor 420 to be turned on when the voltage difference between the switch gate electrode 672 and the drain/source electrode 272 is in a range of 5V to 30 V. Similarly, the blocking gate electrode 677 allows the switch transistor 440 to be turned on when the voltage difference between the switch gate electrode 674 and the drain/source electrode 274 is in a range of 5V to 30 V.

A p-type III-V semiconductor layer 670 is disposed between the gate electrodes 676 and 677 and the barrier film 246. The switch transistors 420 and 440 in the embodiment of FIG. 6 are enhancement-mode transistors. The layer 670 can include an $Al_{(1-y)}Ga_yN$ layer, wherein $0<y\leq 1$ and the carrier impurity is C, Mg, or Si.

Electrodes 672 and 674 are the drain/source and source/drain, respectively, for the circuit 400. The electrode 672 and 674 can include any of the materials as previously described with respect to the electrodes 272 and 274. The electrode 272 is the source/drain of the switch transistor 420 and the drain/source of the bidirectional HEMT 430, and the electrode 274 is the source/drain electrode of the bidirectional HEMT 430 and the drain/source of the switch transistor 440. In an embodiment, the drain/source electrodes 272 and 672 and the source/drain electrodes 274 and 674 can have the same composition and be formed during the same process sequence. In another embodiment, the electrodes 672 and 674 can have a different composition or be formed at a separate time as compared to the electrodes 272 and 274.

The physical design of shielding structures 682 and 684 can be different or the same as the shielding structures 282 and 284. In the embodiment as illustrated in FIG. 6, the shielding structures 682 and 684 are different from the shielding structures 282 and 284. In particular, the shielding structures 682 and 684 have laterally extending portions 6822 and 6842 over gate electrodes 676 and 677, wherein the laterally extending portions 6822 and 6842 are at the same interconnect level as the laterally extending portions 2822 and 2842 of the shielding structures 282 and 284. However, the shielding structures 682 and 684 do not have a laterally extending portion at the same interconnect level as the laterally extending portions 2821 and 2841 of the shielding structures 282 and 284. Referring to the shielding structures 682 and 684, the absence of laterally extending portions at the same interconnect level as the laterally extending portions 2821 and 2841 help to reduce gate-to-drain/source (between the gate electrode 676 and a combination of the drain/source electrode 672 and shielding structure 682) and gate-to-source/drain capacitance (between the gate electrode 677 and a combination of the source/drain electrode 674 and the shielding structure 684), as compared to a different embodiment in which the shielding structures 682 and 684 have a physical design that is the same as the shielding structures 282 and 284.

The shielding structures 682 and 684 can include any of the materials as previously described with respect to the shielding structures 282 and 284. In an embodiment, the shielding structures 282, 284, 682, and 684 can have the same composition and be formed during the same process sequence. In another embodiment, the shielding structures 682 and 684 can have a different composition or be formed at a separate time as compared to the shielding structures 272 and 274.

As previously described, transistors can be depletion-mode transistors or enhancement-mode transistors. The bidirectional HEMTs illustrated in the embodiments of FIGS. 2 and 3 and the switch transistors illustrated in FIG. 5 are depletion-mode transistors. The transistors can be changed to enhancement-mode transistors by full or partial recess of the barrier layer 246 under the gate electrodes 276, 277, 572, and 574 and forming a dielectric film between the barrier film 246 and the gate electrodes 276, 277, 572, and 574. In another embodiment, the transistors can be changed to enhancement-mode transistors by forming a p-type III-V semiconductor layer between the barrier film 246 and the gate electrodes 276, 277, 572, and 574. The switch transistors in the embodiment of FIG. 6 can be changed to depletion-mode transistors by removing the layer 670.

In another alternative embodiment, the openings in the laterally extending portions 3821 and 3841 in FIG. 3 can be used with the laterally extending portions 3822 and 3842 or to any of the other laterally extending portions of the shielding structures in the other embodiments, such as those illustrated in FIGS. 2, 5, and 6. The openings can reduce capacitive coupling and allow faster switching speeds. Similarly, referring to the shielding structures 682 and 684 in FIG. 6, the lack of laterally extending portions at the same interconnect level as the laterally extending portions 2821 and 2841 allow for less capacitive coupling between the gate electrode 676 and the shielding structures 682 and between the gate electrode 677 and the shielding structure 684. Further, the shielding portions of the gate electrodes and the shielding structures also help to reduce capacitive coupling to the opposing electrode of the bidirectional HEMT, circuit, or both, and thus, can allow for faster switching speeds.

Embodiments described herein allow for bidirectional HEMTs in a variety of configurations and circuits. In an embodiment, a circuit can include switching transistors that are integrated in the same die. The circuit can be controlled by the gates of the switch transistor that are not electrically connected to the blocking gates of the bidirectional HEMT. Thus, the voltage range for the gate electrodes for the switch transistors can operate over a smaller voltage range, Shielding structures can have different physical designs that allow a designer more flexibility is designing a circuit and can allow the circuit to operate at faster switching speeds.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1 An electronic device including a bidirectional HEMT, the electronic device including:
  a first drain/source electrode;
  a first source/drain electrode;
  a first blocking gate electrode coupled to the first drain/source electrode;
  a first switch gate electrode disposed between first drain/source electrode and the first blocking gate electrode, wherein the first switch gate electrode is not electrically connected to the first blocking gate electrode;
  a second blocking gate electrode coupled to the first source/drain electrode; and
  a second switch gate electrode disposed between first source/drain electrode and the second blocking gate electrode, wherein the second switch gate electrode is not electrically connected to the second blocking gate electrode,
  wherein the first blocking, first switch, second blocking, and second switch gate electrodes are on a same die.

Embodiment 2 The electronic device of Embodiment 1, further including a first shielding structure electrically connected to the first drain/source electrode and including a first portion that defines a first opening overlying the first switch gate electrode.

Embodiment 3 The electronic device of Embodiment 2, wherein:
  the first shielding structure further includes a second portion that overlies the first portion, the first opening within the first portion, and the first switch gate electrode; and
  the first shielding structure is electrically connected to the first blocking gate electrode.

Embodiment 4 The electronic device of Embodiment 1, further including a first shielding structure electrically connected to the first drain/source electrode and including:
  a first laterally extending portion that is part of a first interconnect level and overlies the first switch gate electrode, and as compared to the first switch gate electrode, the first laterally extending portion extends in a first lateral direction closer to the first source/drain electrode; and
  a second laterally extending portion that is part of a second interconnect level that overlies the first interconnect level, wherein the second laterally extending portion overlies the first switch gate electrode and the first laterally extending portion, and as compared to the first switch gate electrode and the first laterally extending portion, the second laterally extending portion extends in the first lateral direction closer to the first source/drain electrode.

Embodiment 5 The electronic device of Embodiment 4, wherein the first laterally extending portion of the first shielding structure is electrically connected to the first blocking gate electrode.

Embodiment 6 The electronic device of Embodiment 1 further including:
  a second drain/source electrode disposed between the first blocking gate electrode and the first switch gate electrode; and
  a second source/drain electrode disposed between the second blocking gate electrode and the second switch gate electrode.

Embodiment 7 The electronic device of Embodiment 6, further including a first shielding structure coupled to the first drain/source electrode; and a second shielding structure coupled to the second drain/source electrode.

Embodiment 8 The electronic device of Embodiment 7, wherein:
  the second shielding structure includes:
    a first laterally extending portion overlying the first blocking gate electrode and is part of a first interconnect level; and
    a second laterally extending portion overlying the first blocking gate electrode and the first laterally extending portion, wherein the second laterally extending portion is part of a second interconnect level; and
  the first shielding structure includes a laterally extending portion overlying the first switch gate electrode and is part of the second interconnect level, wherein the first shielding structure does not include a laterally extending portion at the first interconnect level that extends over the first switch gate electrode.

Embodiment 9 The electronic device of Embodiment 1, wherein the first switch gate electrode is part of a first switch transistor, and the second switch gate electrode is part of a second switch transistor, wherein the first and second switch transistors are depletion mode transistors.

Embodiment 10 The electronic device of Embodiment 1, wherein the first switch gate electrode is part of a first switch transistor, and the second switch gate electrode is part of a second switch transistor, wherein the first and second switch transistors are enhancement mode transistors.

Embodiment 11 An electronic device including a bidirectional HEMT structure, the electronic device including:
  a drain/source electrode;
  a source/drain electrode;
  a first gate electrode closer to the drain/source electrode than to the source/drain electrode;
  a first shielding structure electrically connected to the drain/source electrode and including a first laterally extending portion, wherein:
    the first laterally extending portion is part of a first interconnect level overlying the first gate electrode; and as compared to the first gate electrode, the first laterally extending portion extends in a horizontal direction closer to the source/drain electrode;

a second gate electrode closer to the source/drain electrode than to the drain/source electrode; and a second shielding structure electrically connected to the source/drain electrode and including a second laterally extending portion, wherein:

the second laterally extending portion is part of a different interconnect level overlying the second gate electrode; and as compared to the second gate electrode, the second laterally extending portion extends in a horizontal direction closer to the drain/source electrode.

Embodiment 12 The electronic device of Embodiment 11, further including a first blocking gate electrode electrically connected to the first shielding structure; and a second blocking gate electrode electrically connected to the second shielding structure.

Embodiment 13 The electronic device of Embodiment 11, wherein the first gate electrode is a first switch gate electrode and is not electrically connected to the first shielding structure and not electrically connected to the second shielding structure; and the second gate electrode is a second switch gate electrode and is not electrically connected to the first shielding structure and not electrically connected to the second shielding structure.

Embodiment 14 The electronic device of Embodiment 13, wherein the first switch gate electrode is part of a first switch transistor, and the second switch gate electrode is part of a second switch transistor, wherein the first and second switch transistors are depletion mode transistors.

Embodiment 15 The electronic device of Embodiment 13, wherein the first switch gate electrode is part of a first switch transistor, and the second switch gate electrode is part of a second switch transistor, wherein the first and second switch transistors are enhancement mode transistors.

Embodiment 16 An electronic device including a HEMT structure, the electronic device including:

a drain/source electrode;

a source/drain electrode;

a first gate electrode closer to the drain/source electrode than to the source/drain electrode; and a first shielding structure electrically connected to the drain/source electrode and including a first portion that defines a first opening overlying the first gate electrode.

Embodiment 17 The electronic device of Embodiment 16, further including a first switch gate electrode, wherein the first gate electrode is a first blocking gate electrode electrically connected to the first shielding structure.

Embodiment 18 The electronic device of Embodiment 17, further including a second switch gate electrode, a second blocking gate electrode and a second shielding structure, wherein:

the first switch gate electrode is disposed between the drain/source electrode and the first blocking gate electrode;

the second switch gate electrode is disposed between the source/drain electrode and the second blocking gate electrode; and the second shielding structure is spaced apart from the first shielding structure and overlies the second switch gate electrode.

Embodiment 19 The electronic device of Embodiment 18, wherein the first switch gate electrode is part of a first switch transistor, and the second switch gate electrode is part of a second switch transistor, wherein the first and second switch transistors are depletion mode transistors.

Embodiment 20 The electronic device of Embodiment 18, wherein the first switch gate electrode is part of a first switch transistor, and the second switch gate electrode is part of a second switch transistor, wherein the first and second switch transistors are enhancement mode transistors.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Certain features are, for clarity, described herein in the context of separate embodiments, may also be provided in combination in a single embodiment. Conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Accordingly, the disclosure is to be regarded as illustrative rather than restrictive.

What is claimed is:

1. An electronic device including a bidirectional high electron mobility transistor, the electronic device comprising:

a first drain/source electrode;

a first source/drain electrode;

a first blocking gate electrode coupled to the first drain/source electrode;

a first switch gate electrode disposed between first drain/source electrode and the first blocking gate electrode, wherein the first switch gate electrode is not electrically connected to the first blocking gate electrode;

a second blocking gate electrode coupled to the first source/drain electrode; and a second switch gate electrode disposed between first source/drain electrode and the second blocking gate electrode, wherein the second switch gate electrode is not electrically connected to the second blocking gate electrode, wherein the first blocking, first switch, second blocking, and second switch gate electrodes are on a same die.

2. The electronic device of claim 1, further comprising a first shielding structure electrically connected to the first drain/source electrode and including a first portion that defines a first opening overlying the first switch gate electrode.

3. The electronic device of claim 2, wherein:
the first shielding structure further includes a second portion that overlies the first portion, the first opening within the first portion, and the first switch gate electrode; and
the first shielding structure is electrically connected to the first blocking gate electrode.

4. The electronic device of claim 1, further comprising a first shielding structure electrically connected to the first drain/source electrode and including:
a first laterally extending portion that is part of a first interconnect level and overlies the first switch gate electrode, and as compared to the first switch gate electrode, the first laterally extending portion extends in a first lateral direction closer to the first source/drain electrode; and
a second laterally extending portion that is part of a second interconnect level that overlies the first interconnect level, wherein the second laterally extending portion overlies the first switch gate electrode and the first laterally extending portion, and as compared to the first switch gate electrode and the first laterally extending portion, the second laterally extending portion extends in the first lateral direction closer to the first source/drain electrode.

5. The electronic device of claim 4, wherein the first laterally extending portion of the first shielding structure is electrically connected to the first blocking gate electrode.

6. The electronic device of claim 1 further comprising:
a second drain/source electrode disposed between the first blocking gate electrode and the first switch gate electrode; and
a second source/drain electrode disposed between the second blocking gate electrode and the second switch gate electrode.

7. The electronic device of claim 6, further comprising:
a first shielding structure coupled to the first drain/source electrode; and
a second shielding structure coupled to the second drain/source electrode.

8. The electronic device of claim 7, wherein:
the second shielding structure includes:
a first laterally extending portion overlying the first blocking gate electrode and is part of a first interconnect level; and
a second laterally extending portion overlying the first blocking gate electrode and the first laterally extending portion, wherein the second laterally extending portion is part of a second interconnect level; and
the first shielding structure includes a laterally extending portion overlying the first switch gate electrode and is part of the second interconnect level, wherein the first shielding structure does not include a laterally extending portion at the first interconnect level that extends over the first switch gate electrode.

9. The electronic device of claim 1, wherein the first switch gate electrode is part of a first switch transistor, and the second switch gate electrode is part of a second switch transistor, wherein the first and second switch transistors are depletion mode transistors.

10. The electronic device of claim 1, wherein the first switch gate electrode is part of a first switch transistor, and the second switch gate electrode is part of a second switch transistor, wherein the first and second switch transistors are enhancement mode transistors.

11. An electronic device including a bidirectional high electron mobility transistor structure, the electronic device comprising:
a drain/source electrode;
a source/drain electrode;
a first gate electrode closer to the drain/source electrode than to the source/drain electrode;
a first shielding structure electrically connected to the drain/source electrode and including a first laterally extending portion, wherein:
the first laterally extending portion overlies the first gate electrode; and
as compared to the first gate electrode, the first laterally extending portion extends in a horizontal direction closer to the source/drain electrode;
a second gate electrode closer to the source/drain electrode than to the drain/source electrode; and
a second shielding structure electrically connected to the source/drain electrode and including a second laterally extending portion, wherein:
the second laterally extending portion overlies the second gate electrode; and
as compared to the second gate electrode, the second laterally extending portion extends in a horizontal direction closer to the drain/source electrode,
wherein:
the first gate electrode is a first switch gate electrode and is not electrically connected to the first shielding structure and not electrically connected to the second shielding structure; and
the second gate electrode is a second switch gate electrode and is not electrically connected to the first fielding structure and not electrically connected to the second shielding structure.

12. The electronic device of claim 11, further comprising:
a first blocking gate electrode electrically connected to the first shielding structure; and
a second blocking gate electrode electrically connected to the second shielding structure.

13. The electronic device of claim 11, wherein the first switch gate electrode is part of a first switch transistor, and the second switch gate electrode is part of a second switch transistor, wherein the first and second switch transistors are depletion mode transistors.

14. The electronic device of claim 11, wherein the first switch gate electrode is part of a first switch transistor, and the second switch gate electrode is part of a second switch transistor, wherein the first and second switch transistors are enhancement mode transistors.

15. The electronic device of claim 11, wherein the first shielding structure further includes a third laterally extending portion overlying the first laterally extending portion and the first gate electrode, wherein as compared to the first gate electrode and the first laterally extending portion, the third laterally extending portion extends in a horizontal direction closer to the source/drain electrode.

16. An electronic device including a bidirectional high electron mobility transistor structure, the electronic device comprising:
a drain/source electrode;
a source/drain electrode;
a first switch gate electrode closer to the drain/source electrode than to the source/drain electrode;
a first blocking gate electrode;
a first shielding structure electrically connected to the drain/source electrode and including a first laterally extending portion and a second laterally extending portion, wherein the first and second laterally extending portions are parts of different interconnect levels;

a second switch gate electrode closer to the source/drain electrode than to the drain/source electrode; and a second blocking gate electrode, wherein each of the first and second blocking gate electrodes is disposed between the first and second switch gate electrodes.

17. The electronic device of claim 16, wherein:

the first switch gate electrode and is not electrically connected to the first shielding structure and not electrically connected to the second shielding structure; and the second switch gate electrode and is not electrically connected to the first shielding structure and not electrically connected to the second shielding structure.

18. The electronic device of claim 17, wherein:

the first blocking gate electrode is electrically connected to the first shielding structure; and the second blocking gate electrode is electrically connected to the second shielding structure.

19. The electronic device of claim 16 further comprising a second shielding structure electrically connected to the source/drain electrode and including a third laterally extending portion and a fourth laterally extending portion overlying the third laterally extending portion, the second switch gate electrode, and the second blocking gate electrode, wherein as compared to the third laterally extending portion, the fourth laterally extending portion extends in a horizontal direction closer to the drain/source electrode.

20. The electronic device of claim 19, wherein:

the first laterally extending portion of the first shielding structure and the third laterally extending portion of the second shielding structure are parts of a same interconnect level; and the second laterally extending portion of the first shielding structure and the fourth laterally extending portion of the second shielding structure are parts of a different interconnect level.

* * * * *